(12) United States Patent
Wu et al.

(10) Patent No.: US 10,818,606 B1
(45) Date of Patent: Oct. 27, 2020

(54) ALIGNMENT MARK PATTERNS AND WAFER STRUCTURES COMPRISING THE SAME

(71) Applicant: Vanguard International Semiconductor Corporation, Hsinchu (TW)

(72) Inventors: Jun-Che Wu, Hsinchu (TW); Jing-Hua Chiang, Hsinchu (TW); Wen-Keir Liang, Jhudong Township (TW); Ming-Yu Chen, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/373,381

(22) Filed: Apr. 2, 2019

(51) Int. Cl.
*H01L 23/544* (2006.01)

(52) U.S. Cl.
CPC .. *H01L 23/544* (2013.01); *H01L 2223/54426* (2013.01)

(58) Field of Classification Search
CPC ................................................ H01L 23/544
See application file for complete search history.

(56) References Cited

U.S. PATENT DOCUMENTS

| | | | |
|---|---|---|---|
| 6,858,948 B2 * | 2/2005 | Van Haren | G03F 7/70633 257/797 |
| 7,880,880 B2 | 2/2011 | Van Bilsen et al. | |
| 9,123,729 B2 * | 9/2015 | Tsai | H01L 23/544 |
| 2009/0020499 A1 * | 1/2009 | Nottola | G02B 6/42 216/2 |
| 2015/0179584 A1 * | 6/2015 | Woerz | H01L 22/12 257/797 |

OTHER PUBLICATIONS

Taiwanese Office Action and Search Report for Taiwanese Application No. 108105923, dated Nov. 29, 2019.

* cited by examiner

*Primary Examiner* — Fernando L Toledo
*Assistant Examiner* — Valerie N Newton
(74) *Attorney, Agent, or Firm* — Birch, Stewart, Kolasch & Birch, LLP

(57) ABSTRACT

An alignment mark pattern is provided. The alignment mark pattern includes a first region that includes a first line and a first space having different widths therebetween, a second region that includes a second line and a second space having different widths therebetween, a third region that includes a third line and a third space having different widths therebetween, and a fourth region that includes a fourth line and a fourth space having different widths therebetween. The first and second lines extend in a first direction. The third and fourth lines extend in a second direction perpendicular to the first direction. The first region is diagonal to the second region. The third region is diagonal to the fourth region. The third region is adjacent to the first and second regions. The fourth region is adjacent to the first and second regions.

20 Claims, 4 Drawing Sheets

ALIGNMENT MARK PATTERNS AND WAFER STRUCTURES COMPRISING THE SAME

TECHNICAL FIELD

The technical field relates to an alignment mark pattern that includes various sizes of lines and spaces.

BACKGROUND

A traditional epitaxial process has a great influence on the capture of exposure signals of alignment marks. If the thickness of an epitaxial layer increases gradually during multiple epitaxial processes, the capture of the exposure signals of alignment marks by a stepper will deteriorate, which causes serious defects in the process, such as wafer rejection or overlay shift. Due to the trends of customization in the future, it is an important consideration to, for example, increase the number of epitaxial processes or increase the thickness of the epitaxial layer. However, these demands will seriously affect the stepper's ability to capture the exposure signals of alignment marks.

Currently, persons skilled in the art are trying to solve the above-mentioned problem of the inadequate capturing of exposure signals by repeatedly making a plurality of alignment marks on different epitaxial layers. However, due to the increase in the number of alignment marks, it is necessary to add a number of related lithography processes, which results in a substantial increase in production costs and the need to spend more time processing, as well as other negative results.

Therefore, development of an alignment mark pattern without re-production on layers, even in the case of multiple epitaxial processes, is desirable.

SUMMARY

In accordance with one embodiment of the invention, an alignment mark pattern is provided. The alignment mark pattern includes a first region, a second region, a third region and a fourth region. The first region includes a plurality of first lines and a plurality of first spaces which are arranged to alternate with each other and which extend in a first direction. The first line has a different width than the first space. The second region includes a plurality of second lines and a plurality of second spaces which are arranged to alternate with each other and which extend in the first direction. The second region is diagonal to the first region. The second line has a different width than the second space. The third region includes a plurality of third lines and a plurality of third spaces which are arranged to alternate with each other and which extend in a second direction. The second direction is perpendicular to the first direction. The third region is adjacent to the first region and the second region. The third line has a different width than the third space. In addition, the fourth region includes a plurality of fourth lines and a plurality of fourth spaces which are arranged to alternate with each other and which extend in the second direction. The fourth region is diagonal to the third region and adjacent to the first and second regions. The fourth line has a different width than the fourth space.

In some embodiments, the sum of the width of one first line and the width of one first space is greater than or less than the sum of the width of one second line and the width of one second space.

In some embodiments, when the sum (pitch) of the width of one first line and the width of one first space is greater than the sum (pitch) of the width of one second line and the width of one second space, the sum of the width of one first line and the width of one first space is in a range from about 11.6 μm to about 26.6 μm, and the sum of the width of one second line and the width of one second space is in a range from about 10 μm to about 25 μm. In some embodiments, when the sum of the width of one first line and the width of one first space is greater than the sum of the width of one second line and the width of one second space, the width of one first line is in a range from about 1.8 μm to about 12.8 μm, the width of one first space is in a range from about 6.3 μm to about 24.8 μm, the width of one second line is in a range from about 1 μm to about 12 μm, and the width of one second space is in a range from about 5.5 μm to about 24 μm. The width of one first space is greater than that of one first line. The width of one second space is greater than that of one second line.

In some embodiments, when the sum (pitch) of the width of one first line and the width of one first space is less than the sum (pitch) of the width of one second line and the width of one second space, the sum of the width of one first line and the width of one first space is in a range from about 10 μm to about 25 μm, and the sum of the width of one second line and the width of one second space is in a range from about 11.6 μm to about 26.6 μm. In some embodiments, when the sum of the width of one first line and the width of one first space is less than the sum of the width of one second line and the width of one second space, the width of one first line is in a range from about 1 μm to about 12 μm, the width of one first space is in a range from about 5.5 μm to about 24 μm, the width of one second line is in a range from about 1.8 μm to about 12.8 μm, and the width of one second space is in a range from about 6.3 μm to about 24.8 μm. The width of one first space is greater than that of one first line. The width of one second space is greater than that of one second line.

In some embodiments, the sum of the width of one third line and the width of one third space is greater than or less than the sum of the width of one fourth line and the width of one fourth space.

In some embodiments, when the sum (pitch) of the width of one third line and the width of one third space is greater than the sum (pitch) of the width of one fourth line and the width of one fourth space, the sum of the width of one third line and the width of one third space is in a range from about 11.6 μm to about 26.6 μm, and the sum of the width of one fourth line and the width of one fourth space is in a range from about 10 μm to about 25 μm. In some embodiments, when the sum of the width of one third line and the width of one third space is greater than the sum of the width of one fourth line and the width of one fourth space, the width of one third line is in a range from about 1.8 μm to about 12.8 μm, the width of one third space is in a range from about 6.3 μm to about 24.8 μm, the width of one fourth line is in a range from about 1 μm to about 12 μm, and the width of one fourth space is in a range from about 5.5 μm to about 24 μm. The width of one third space is greater than that of one third line. The width of one fourth space is greater than that of one fourth line.

In some embodiments, when the sum (pitch) of the width of one third line and the width of one third space is less than the sum (pitch) of the width of one fourth line and the width of one fourth space, the sum of the width of one third line and the width of one third space is in a range from about 10 μm to about 25 μm, and the sum of the width of one fourth line and the width of one fourth space is in a range from about 11.6 μm to about 26.6 μm. In some embodiments, when the sum of the width of one third line and the width of one third space is less than the sum of the width of one fourth line and the width of one fourth space, the width of one third line is in a range from about 1 μm to about 12 μm, the width of one third space is in a range from about 5.5 μm to about 24 μm, the width of one fourth line is in a range from about 1.8 μm to about 12.8 μm, and the width of one fourth space is in a range from about 6.3 μm to about 24.8 μm. The width of one third space is greater than that of one third line. The width of one fourth space is greater than that of one fourth line.

In some embodiments, the alignment mark pattern further includes a cross pattern disposed between the first region and the second region and between the third region and the fourth region. In some embodiments, the cross pattern includes a fifth line and a sixth line perpendicular to the fifth line. In some embodiments, the fifth line and the sixth line have a width which is in a range from about 3 μm to about 17 μm. In some embodiments, the fifth line and the sixth line have a length which is in a range from about 50 μm to about 100 μm.

In accordance with one embodiment of the invention, a wafer structure is provided. The wafer structure includes a wafer having a plurality of mark regions, a material layer, and a plurality of alignment mark patterns as described above. The material layer is formed on the wafer. The alignment mark patterns are disposed on the material layer and located within the respective mark regions of the wafer.

In some embodiments, the mark regions are adjacent to the edge of the wafer. In some embodiments, the material layer includes an epitaxial layer. In some embodiments, the material layer has a thickness which is in a range from about 6 μm to about 10 μm. In some embodiments, the alignment mark patterns are opposite to each other.

In the present invention, depending on the process requirements, the specific alignment mark patterns that includes an appropriate sum (pitch) of widths of single line and space (for example, the sum (pitch) of the widths of single line and space is between 10 μm and 25 μm) with various sizes of lines and spaces and the space size larger than the line size is designed to use for alignment in a semiconductor process. Different from the traditional design to make the line and space into the same size, in the present invention, the space size is designed to be larger than the line size, so that even after multiple epitaxial processes, the spaces with sufficient depth/width can accommodate more epitaxial materials therein, and the alignment mark patterns can maintain a fairly good exposure signal intensity, effectively improving the problems wherein the traditional stepper has a poor ability to capture the exposure signals of the alignment marks. These problems are caused by increasing the number of epitaxial processes or increasing the thickness of the epitaxial layer. In the present invention, there is no need to add alignment mark patterns on other layers. The subsequent alignment process can be performed continuously, which not only reduces the overall production cost but also eliminates the processing time required to conduct additional processes.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
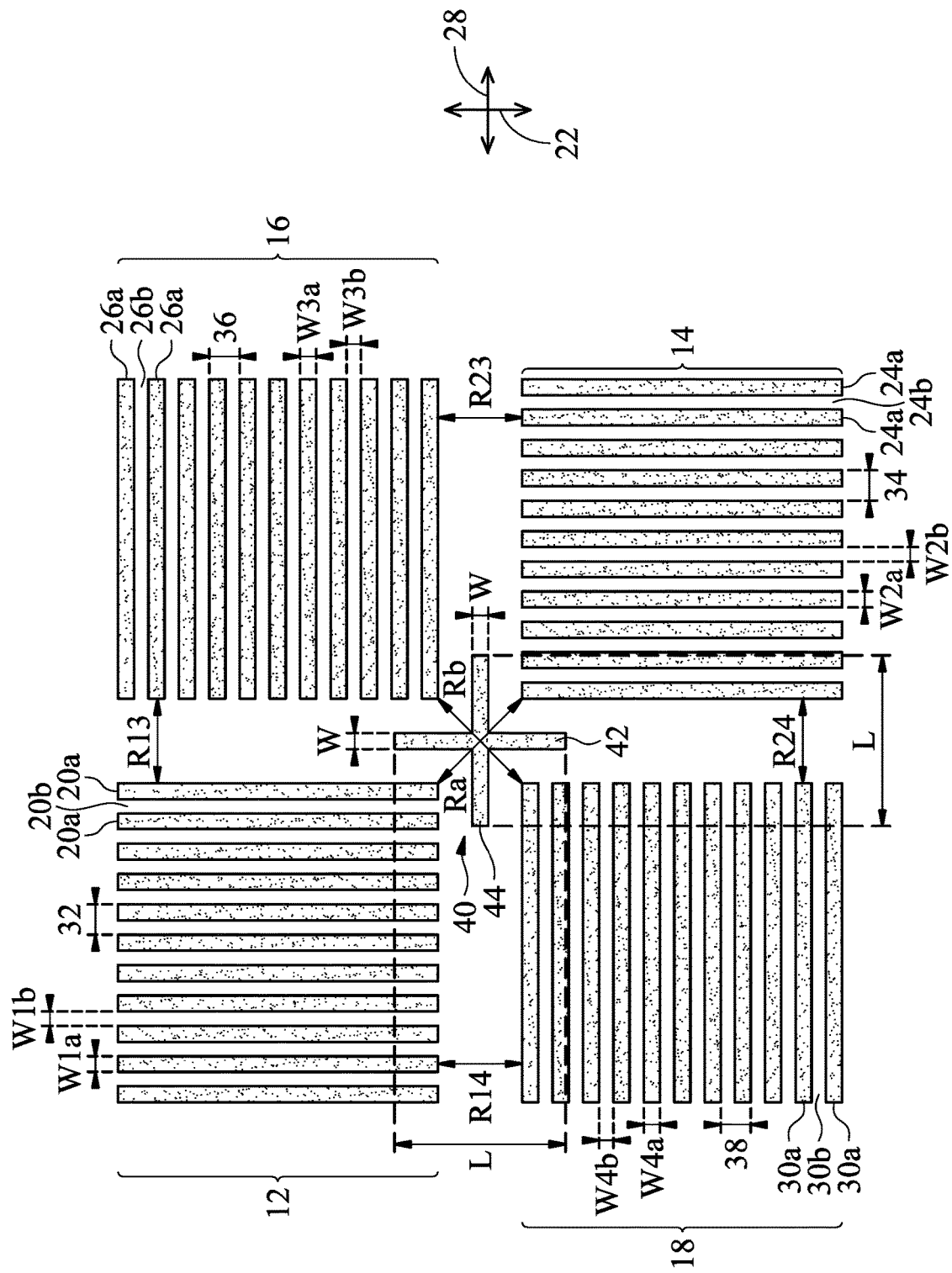
FIG. 1 is a top view of an alignment mark pattern in accordance with one embodiment of the invention.

Referring to FIG. 1, in accordance with one embodiment of the invention, an alignment mark pattern 10 is provided. FIG. 1 is a top view of the alignment mark pattern 10.

As shown in FIG. 1, the alignment mark pattern 10 includes a first region 12, a second region 14, a third region 16 and a fourth region 18. The first region 12 includes a plurality of first lines 20a and a plurality of first spaces 20b. The first spaces 20b are respectively located between the first lines 20a. The first lines 20a are parallel to each other and extend in a first direction 22. Specifically, the width W1a of the first line 20a is different from the width W1b of the first space 20b. The second region 14 includes a plurality of second lines 24a and a plurality of second spaces 24b. The second spaces 24b are respectively located between the second lines 24a. The second lines 24a are parallel to each other and extend in the first direction 22. The second region 14 is diagonal to the first region 12, and there is a specific distance Ra between the second region 14 and the first region 12. Specifically, the width W2a of the second line 24a is different from the width W2b of the second space 24b. The third region 16 includes a plurality of third lines 26a and a plurality of third spaces 26b. The third spaces 26b are respectively located between the third lines 26a. The third lines 26a are parallel to each other and extend in a second direction 28. The second direction 28 is perpendicular to the first direction 22. The third region 16 is adjacent to the first region 12, and there is a specific distance R13 between the third region 16 and the first region 12. The third region 16 is adjacent to the second region 14, and there is a specific distance R23 between the third region 16 and the second region 14. The third region 16 and the first region 12 are arranged in the second direction 28. The third region 16 and the second region 14 are arranged in the first direction 22. Specifically, the width W3a of the third line 26a is different from the width W3b of the third space 26b. The fourth region 18 includes a plurality of fourth lines 30a and a plurality of fourth spaces 30b. The fourth spaces 30b are respectively located between the fourth lines 30a. The fourth lines 30a are parallel to each other and extend in the second direction 28. The fourth region 18 is diagonal to the third region 16, and there is a specific distance Rb between the fourth region 18 and the third region 16. The fourth region 18 is adjacent to the first region 12, and there is a specific distance R14 between the fourth region 18 and the first region 12. The fourth region 18 is adjacent to the second region 14, and there is a specific distance R24 between the fourth region 18 and the second region 14. In addition, the fourth region 18 and the first region 12 are arranged in the first direction 22. The fourth region 18 and the second region 14 are arranged in the second direction 28. Specifically, the width W4a of the fourth line 30a is different from the width W4b of the fourth space 30b.

In some embodiments, the specific distance Ra between the second region 14 and the first region 12, the specific distance Rb between the fourth region 18 and the third region 16, the specific distance R13 between the third region 16 and the first region 12, the specific distance R14 between the fourth region 18 and the first region 12, the specific distance R23 between the third region 16 and the second region 14, and the specific distance R24 between the fourth region 18 and the second region 14 may include any proper distance to meet the specifications of the alignment mark pattern 10.

First, the structural features of each line and space within the first region 12 and the second region 14 are described.

In some embodiments, the sum (pitch) 32 of the width W1a of one first line 20a and the width W1b of one first space 20b may be greater than or less than the sum (pitch) 34 of the width W2a of one second line 24a and the width W2b of one second space 24b.

In some embodiments, when the sum 32 of the width W1a of one first line 20a and the width W1b of one first space 20b is greater than the sum 34 of the width W2a of one second line 24a and the width W2b of one second space 24b, the sum 32 of the width W1a of one first line 20a and the width W1b of one first space 20b is in a range from about 11.6 μm to about 26.6 μm, for example, 11.6 μm, 17.6 μm or 26.6 μm, and the sum 34 of the width W2a of one second line 24a and the width W2b of one second space 24b is in a range from about 10 μm to about 25 μm, for example, 10 μm, 16 μm or 25 μm. In some embodiments, when the sum 32 of the width W1a of one first line 20a and the width W1b of one first space 20b is greater than the sum 34 of the width W2a of one second line 24a and the width W2b of one second space 24b, the width W1a of one first line 20a is in a range from about 1.8 μm to about 12.8 μm, the width W1b of one first space 20b is in a range from about 6.3 μm to about 24.8 μm, the width W2a of one second line 24a is in a range from about 1 μm to about 12 μm, and the width W2b of one second space 24b is in a range from about 5.5 μm to about 24 μm. The width W1b of one first space 20b is greater than the width W1a of one first line 20a. The width W2b of one second space 24b is greater than the width W2a of one second line 24a.

In some embodiments, when the sum 32 of the width W1a of one first line 20a and the width W1b of one first space 20b is 11.6 μm, the width W1a of one first line 20a and the width W1b of one first space 20b may include any combination of sizes that is not equal to each other. For example, (1) the width W1a of one first line 20a is about 1.8 μm, and the width W1b of one first space 20b is about 9.8 μm, (2) the width W1a of one first line 20a is about 2.3 μm, and the width W1b of one first space 20b is about 9.3 μm, (3) the width W1a of one first line 20a is about 2.8 μm, and the width W1b of one first space 20b is about 8.8 μm, (4) the width W1a of one first line 20a is about 3.3 μm, and the width W1b of one first space 20b is about 8.3 μm, (5) the width W1a of one first line 20a is about 3.8 μm, and the width W1b of one first space 20b is about 7.8 μm, (6) the width W1a of one first line 20a is about 4.3 μm, and the width W1b of one first space 20b is about 7.3 μm, (7) the width W1a of one first line 20a is about 4.8 μm, and the width W1b of one first space 20b is about 6.8 μm, or (8) the width W1a of one first line 20a is about 5.3 μm, and the width W1b of one first space 20b is about 6.3 μm (the sum (pitch) 32 of the width W1a of one first line 20a and the width W1b of one first space 20b is 11.6 μm).

At this time, the sum 34 of the width W2a of one second line 24a and the width W2b of one second space 24b is 10 μm. The width W2a of one second line 24a and the width W2b of one second space 24b may include any combination of sizes that is not equal to each other. For example, (1) the width W2a of one second line 24a is about 1 μm, and the width W2b of one second space 24b is about 9 μm, (2) the width W2a of one second line 24a is about 1.5 μm, and the width W2b of one second space 24b is about 8.5 μm, (3) the width W2a of one second line 24a is about 2 μm, and the width W2b of one second space 24b is about 8 μm, (4) the width W2a of one second line 24a is about 2.5 μm, and the width W2b of one second space 24b is about 7.5 μm, (5) the width W2a of one second line 24a is about 3 μm, and the width W2b of one second space 24b is about 7 μm, (6) the width W2a of one second line 24a is about 3.5 μm, and the width W2b of one second space 24b is about 6.5 μm, (7) the width W2a of one second line 24a is about 4 μm, and the width W2b of one second space 24b is about 6 μm, or (8) the width W2a of one second line 24a is about 4.5 μm, and the width W2b of one second space 24b is about 5.5 μm (the sum (pitch) 34 of the width W2a of one second line 24a and the width W2b of one second space 24b is 10 μm). In some embodiments, the width W1a of one first line 20a differs from the width W2a of one second line 24a by about 0.8 μm. For example, the width W1a of one first line 20a is greater than the width W2a of one second line 24a by about 0.8 μm. Similarly, the width W1b of one first space 20b differs from the width W2b of one second space 24b by about 0.8 μm. For example, the width W1b of one first space 20b is greater than the width W2b of one second space 24b by about 0.8 μm.

In some embodiments, when the sum 32 of the width W1a of one first line 20a and the width W1b of one first space 20b is 17.6 μm, the width W1a of one first line 20a and the width W1b of one first space 20b may include any combination of sizes that is not equal to each other. For example, (1) the width W1a of one first line 20a is about 1.8 μm, and the width W1b of one first space 20b is about 15.8 μm, (2) the width W1a of one first line 20a is about 2.3 μm, and the width W1b of one first space 20b is about 15.3 μm, (3) the width W1a of one first line 20a is about 2.8 μm, and the width W1b of one first space 20b is about 14.8 μm, (4) the width W1a of one first line 20a is about 3.3 μm, and the width W1b of one first space 20b is about 14.3 μm, (5) the width W1a of one first line 20a is about 3.8 μm, and the width W1b of one first space 20b is about 13.8 μm, (6) the width W1a of one first line 20a is about 4.3 μm, and the width W1b of one first space 20b is about 13.3 μm, (7) the width W1a of one first line 20a is about 4.8 μm, and the width W1b of one first space 20b is about 12.8 μm, (8) the width W1a of one first line 20a is about 5.3 μm, and the width W1b of one first space 20b is about 12.3 μm, (9) the width W1a of one first line 20a is about 5.8 μm, and the width W1b of one first space 20b is about 11.8 μm, (10) the width W1a of one first line 20a is about 6.3 μm, and the width W1b of one first space 20b is about 11.3 μm, (11) the width W1a of one first line 20a is about 6.8 μm, and the width W1b of one first space 20b is about 10.8 μm, (12) the width W1a of one first line 20a is about 7.3 μm, and the width W1b of one first space 20b is about 10.3 μm, (13) the width W1a of one first line 20a is about 7.8 μm, and the width W1b of one first space 20b is about 9.8 μm, or (14) the width W1a of one first line 20a is about 8.3 µm, and the width W1b of one first space 20b is about 9.3 µm (the sum (pitch) 32 of the width W1a of one first line 20a and the width W1b of one first space 20b is 17.6 µm).

At this time, the sum 34 of the width W2a of one second line 24a and the width W2b of one second space 24b is 16 µm. The width W2a of one second line 24a and the width W2b of one second space 24b may include any combination of sizes that is not equal to each other. For example, (1) the width W2a of one second line 24a is about 1 µm, and the width W2b of one second space 24b is about 15 µm, (2) the width W2a of one second line 24a is about 1.5 µm, and the width W2b of one second space 24b is about 14.5 µm, (3) the width W2a of one second line 24a is about 2 µm, and the width W2b of one second space 24b is about 14 µm, (4) the width W2a of one second line 24a is about 2.5 µm, and the width W2b of one second space 24b is about 13.5 µm, (5) the width W2a of one second line 24a is about 3 µm, and the width W2b of one second space 24b is about 13 µm, (6) the width W2a of one second line 24a is about 3.5 µm, and the width W2b of one second space 24b is about 12.5 µm, (7) the width W2a of one second line 24a is about 4 µm, and the width W2b of one second space 24b is about 12 µm, (8) the width W2a of one second line 24a is about 4.5 µm, and the width W2b of one second space 24b is about 11.5 µm, (9) the width W2a of one second line 24a is about 5 µm, and the width W2b of one second space 24b is about 11 µm, (10) the width W2a of one second line 24a is about 5.5 µm, and the width W2b of one second space 24b is about 10.5 µm, (11) the width W2a of one second line 24a is about 6 µm, and the width W2b of one second space 24b is about 10 µm, (12) the width W2a of one second line 24a is about 6.5 µm, and the width W2b of one second space 24b is about 9.5 µm, (13) the width W2a of one second line 24a is about 7 µm, and the width W2b of one second space 24b is about 9 µm, or (14) the width W2a of one second line 24a is about 7.5 µm, and the width W2b of one second space 24b is about 8.5 µm (the sum (pitch) 34 of the width W2a of one second line 24a and the width W2b of one second space 24b is 16 µm). In some embodiments, the width W1a of one first line 20a differs from the width W2a of one second line 24a by about 0.8 µm. For example, the width W1a of one first line 20a is greater than the width W2a of one second line 24a by about 0.8 µm. Similarly, the width W1b of one first space 20b differs from the width W2b of one second space 24b by about 0.8 µm. For example, the width W1b of one first space 20b is greater than the width W2b of one second space 24b by about 0.8 µm.

In some embodiments, when the sum 32 of the width W1a of one first line 20a and the width W1b of one first space 20b is 26.6 µm, the width W1a of one first line 20a and the width W1b of one first space 20b may include any combination of sizes that is not equal to each other. For example, (1) the width W1a of one first line 20a is about 1.8 µm, and the width W1b of one first space 20b is about 24.8 µm, (2) the width W1a of one first line 20a is about 2.3 µm, and the width W1b of one first space 20b is about 24.3 µm, (3) the width W1a of one first line 20a is about 2.8 µm, and the width W1b of one first space 20b is about 23.8 µm, (4) the width W1a of one first line 20a is about 3.3 µm, and the width W1b of one first space 20b is about 23.3 µm, (5) the width W1a of one first line 20a is about 3.8 µm, and the width W1b of one first space 20b is about 22.8 µm, (6) the width W1a of one first line 20a is about 4.3 µm, and the width W1b of one first space 20b is about 22.3 µm, (7) the width W1a of one first line 20a is about 4.8 µm, and the width W1b of one first space 20b is about 21.8 µm, (8) the width W1a of one first line 20a is about 5.3 µm, and the width W1b of one first space 20b is about 21.3 µm, (9) the width W1a of one first line 20a is about 5.8 µm, and the width W1b of one first space 20b is about 20.8 µm, (10) the width W1a of one first line 20a is about 6.3 µm, and the width W1b of one first space 20b is about 20.3 µm, (11) the width W1a of one first line 20a is about 6.8 µm, and the width W1b of one first space 20b is about 19.8 µm, (12) the width W1a of one first line 20a is about 7.3 µm, and the width W1b of one first space 20b is about 19.3 µm, (13) the width W1a of one first line 20a is about 7.8 µm, and the width W1b of one first space 20b is about 18.8 µm, (14) the width W1a of one first line 20a is about 8.3 µm, and the width W1b of one first space 20b is about 18.3 µm, (15) the width W1a of one first line 20a is about 8.8 µm, and the width W1b of one first space 20b is about 17.8 µm, (16) the width W1a of one first line 20a is about 9.3 µm, and the width W1b of one first space 20b is about 17.3 µm, (17) the width W1a of one first line 20a is about 9.8 µm, and the width W1b of one first space 20b is about 16.8 µm, (18) the width W1a of one first line 20a is about 10.3 µm, and the width W1b of one first space 20b is about 16.3 µm, (19) the width W1a of one first line 20a is about 10.8 µm, and the width W1b of one first space 20b is about 15.8 µm, (20) the width W1a of one first line 20a is about 11.3 µm, and the width W1b of one first space 20b is about 15.3 µm, (21) the width W1a of one first line 20a is about 11.8 µm, and the width W1b of one first space 20b is about 14.8 µm, (22) the width W1a of one first line 20a is about 12.3 µm, and the width W1b of one first space 20b is about 14.3 µm, or (23) the width W1a of one first line 20a is about 12.8 µm, and the width W1b of one first space 20b is about 13.8 µm (the sum (pitch) 32 of the width W1a of one first line 20a and the width W1b of one first space 20b is 26.6 µm).

At this time, the sum 34 of the width W2a of one second line 24a and the width W2b of one second space 24b is 25 µm. The width W2a of one second line 24a and the width W2b of one second space 24b may include any combination of sizes that is not equal to each other. For example, (1) the width W2a of one second line 24a is about 1 µm, and the width W2b of one second space 24b is about 24 µm, (2) the width W2a of one second line 24a is about 1.5 µm, and the width W2b of one second space 24b is about 23.5 µm, (3) the width W2a of one second line 24a is about 2 µm, and the width W2b of one second space 24b is about 23 µm, (4) the width W2a of one second line 24a is about 2.5 µm, and the width W2b of one second space 24b is about 22.5 µm, (5) the width W2a of one second line 24a is about 3 µm, and the width W2b of one second space 24b is about 22 µm, (6) the width W2a of one second line 24a is about 3.5 µm, and the width W2b of one second space 24b is about 21.5 µm, (7) the width W2a of one second line 24a is about 4 µm, and the width W2b of one second space 24b is about 21 µm, (8) the width W2a of one second line 24a is about 4.5 µm, and the width W2b of one second space 24b is about 20.5 µm, (9) the width W2a of one second line 24a is about 5 µm, and the width W2b of one second space 24b is about 20 µm, (10) the width W2a of one second line 24a is about 5.5 µm, and the width W2b of one second space 24b is about 19.5 µm, (11) the width W2a of one second line 24a is about 6 µm, and the width W2b of one second space 24b is about 19 µm, (12) the width W2a of one second line 24a is about 6.5 µm, and the width W2b of one second space 24b is about 18.5 µm, (13) the width W2a of one second line 24a is about 7 µm, and the width W2b of one second space 24b is about 18 µm, (14) the width W2a of one second line 24a is about 7.5 µm, and the width W2b of one second space 24b is about 17.5 µm, (15) the width W2a of one second line 24a is about 8 µm, and the width W2b of one second space 24b is about 17 µm, (16) the width W2a of one second line 24a is about 8.5 µm, and the width W2b of one second space 24b is about 16.5 µm, (17) the width W2a of one second line 24a is about 9 µm, and the width W2b of one second space 24b is about 16 µm, (18) the width W2a of one second line 24a is about 9.5 µm, and the width W2b of one second space 24b is about 15.5 µm, (19) the width W2a of one second line 24a is about 10 µm, and the width W2b of one second space 24b is about 15 µm, (20) the width W2a of one second line 24a is about 10.5 µm, and the width W2b of one second space 24b is about 14.5 µm, (21) the width W2a of one second line 24a is about 11 µm, and the width W2b of one second space 24b is about 14 µm, (22) the width W2a of one second line 24a is about 11.5 µm, and the width W2b of one second space 24b is about 13.5 µm, or (23) the width W2a of one second line 24a is about 12 µm, and the width W2b of one second space 24b is about 13 µm (the sum (pitch) 34 of the width W2a of one second line 24a and the width W2b of one second space 24b is 25 µm). In some embodiments, the width W1a of one first line 20a differs from the width W2a of one second line 24a by about 0.8 µm. For example, the width W1a of one first line 20a is greater than the width W2a of one second line 24a by about 0.8 µm. Similarly, the width W1b of one first space 20b differs from the width W2b of one second space 24b by about 0.8 µm. For example, the width W1b of one first space 20b is greater than the width W2b of one second space 24b by about 0.8 µm.

In some embodiments, when the sum 32 of the width W1a of one first line 20a and the width W1b of one first space 20b is less than the sum 34 of the width W2a of one second line 24a and the width W2b of one second space 24b, the sum 32 of the width W1a of one first line 20a and the width W1b of one first space 20b is in a range from about 10 µm to about 25 µm, for example, 10 µm, 16 µm or 25 µm, and the sum 34 of the width W2a of one second line 24a and the width W2b of one second space 24b is in a range from about 11.6 µm to about 26.6 µm, for example, 11.6 µm, 17.6 µm or 26.6 µm. In some embodiments, when the sum 32 of the width W1a of one first line 20a and the width W1b of one first space 20b is less than the sum 34 of the width W2a of one second line 24a and the width W2b of one second space 24b, the width W1a of one first line 20a is in a range from about 1 µm to about 12 µm, the width W1b of one first space 20b is in a range from about 5.5 µm to about 24 µm, the width W2a of one second line 24a is in a range from about 1.8 µm to about 12.8 µm, and the width W2b of one second space 24b is in a range from about 6.3 µm to about 24.8 µm. The width W1b of one first space 20b is greater than the width W1a of one first line 20a. The width W2b of one second space 24b is greater than the width W2a of one second line 24a.

In some embodiments, when the sum 32 of the width W1a of one first line 20a and the width W1b of one first space 20b is 10 µm (the sum 34 of the width W2a of one second line 24a and the width W2b of one second space 24b is correspondingly 11.6 µm), the width W1a of one first line 20a and the width W1b of one first space 20b may include any combination of sizes that is not equal to each other as listed above (only the sum (pitch) 32 of the width W1a of one first line 20a and the width W1b of one first space 20b is 10 µm). Similarly, the width W2a of one second line 24a and the width W2b of one second space 24b may include any combination of sizes that is not equal to each other as listed above (only the sum (pitch) 34 of the width W2a of one second line 24a and the width W2b of one second space 24b is 11.6 µm). Various combinations of sizes are not repeated here. In some embodiments, the width W1a of one first line 20a differs from the width W2a of one second line 24a by about 0.8 µm. For example, the width W1a of one first line 20a is less than the width W2a of one second line 24a by about 0.8 µm. Similarly, the width W1b of one first space 20b differs from the width W2b of one second space 24b by about 0.8 µm. For example, the width W1b of one first space 20b is less than the width W2b of one second space 24b by about 0.8 µm.

In some embodiments, when the sum 32 of the width W1a of one first line 20a and the width W1b of one first space 20b is 16 µm (the sum 34 of the width W2a of one second line 24a and the width W2b of one second space 24b is correspondingly 17.6 µm), the width W1a of one first line 20a and the width W1b of one first space 20b may include any combination of sizes that is not equal to each other as listed above (only the sum (pitch) 32 of the width W1a of one first line 20a and the width W1b of one first space 20b is 16 µm). Similarly, the width W2a of one second line 24a and the width W2b of one second space 24b may include any combination of sizes that is not equal to each other as listed above (only the sum (pitch) 34 of the width W2a of one second line 24a and the width W2b of one second space 24b is 17.6 µm). Various combinations of sizes are not repeated here. In some embodiments, the width W1a of one first line 20a differs from the width W2a of one second line 24a by about 0.8 µm. For example, the width W1a of one first line 20a is less than the width W2a of one second line 24a by about 0.8 µm. Similarly, the width W1b of one first space 20b differs from the width W2b of one second space 24b by about 0.8 µm. For example, the width W1b of one first space 20b is less than the width W2b of one second space 24b by about 0.8 µm.

In some embodiments, when the sum 32 of the width W1a of one first line 20a and the width W1b of one first space 20b is 25 µm (the sum 34 of the width W2a of one second line 24a and the width W2b of one second space 24b is correspondingly 26.6 µm), the width W1a of one first line 20a and the width W1b of one first space 20b may include any combination of sizes that is not equal to each other as listed above (only the sum (pitch) 32 of the width W1a of one first line 20a and the width W1b of one first space 20b is 25 µm). Similarly, the width W2a of one second line 24a and the width W2b of one second space 24b may include any combination of sizes that is not equal to each other as listed above (only the sum (pitch) 34 of the width W2a of one second line 24a and the width W2b of one second space 24b is 26.6 µm). Various combinations of sizes are not repeated here. In some embodiments, the width W1a of one first line 20a differs from the width W2a of one second line 24a by about 0.8 µm. For example, the width W1a of one first line 20a is less than the width W2a of one second line 24a by about 0.8 µm. Similarly, the width W1b of one first space 20b differs from the width W2b of one second space 24b by about 0.8 µm. For example, the width W1b of one first space 20b is less than the width W2b of one second space 24b by about 0.8 µm.

Next, the structural features of each line and space within the third region 16 and the fourth region 18 are described.

In some embodiments, the sum (pitch) 36 of the width W3a of one third line 26a and the width W3b of one third space 26b may be greater than or less than the sum (pitch) 38 of the width W4a of one fourth line 30a and the width W4b of one fourth space 30b.

In some embodiments, when the sum 36 of the width W3a of one third line 26a and the width W3b of one third space 26b is greater than the sum 38 of the width W4a of one fourth line 30a and the width W4b of one fourth space 30b, the sum 36 of the width W3a of one third line 26a and the width W3b of one third space 26b is in a range from about 11.6 µm to about 26.6 µm, for example, 11.6 µm, 17.6 µm or 26.6 µm, and the sum 38 of the width W4a of one fourth line 30a and the width W4b of one fourth space 30b is in a range from about 10 µm to about 25 µm, for example, 10 µm, 16 µm or 25 µm. In some embodiments, when the sum 36 of the width W3a of one third line 26a and the width W3b of one third space 26b is greater than the sum 38 of the width W4a of one fourth line 30a and the width W4b of one fourth space 30b, the width W3a of one third line 26a is in a range from about 1.8 µm to about 12.8 µm, the width W3b of one third space 26b is in a range from about 6.3 µm to about 24.8 µm, the width W4a of one fourth line 30a is in a range from about 1 µm to about 12 µm, and the width W4b of one fourth space 30b is in a range from about 5.5 µm to about 24 µm. The width W3b of one third space 26b is greater than the width W3a of one third line 26a. The width W4b of one fourth space 30b is greater than the width W4a of one fourth line 30a.

In some embodiments, when the sum 36 of the width W3a of one third line 26a and the width W3b of one third space 26b is 11.6 µm (the sum 38 of the width W4a of one fourth line 30a and the width W4b of one fourth space 30b is correspondingly 10 µm), the width W3a of one third line 26a and the width W3b of one third space 26b may include any combination of sizes that is not equal to each other as listed above (only the sum 36 of the width W3a of one third line 26a and the width W3b of one third space 26b is 11.6 µm). Similarly, the width W4a of one fourth line 30a and the width W4b of one fourth space 30b may include any combination of sizes that is not equal to each other as listed above (only the sum 38 of the width W4a of one fourth line 30a and the width W4b of one fourth space 30b is 10 µm). Various combinations of sizes are not repeated here. In some embodiments, the width W3a of one third line 26a differs from the width W4a of one fourth line 30a by about 0.8 µm. For example, the width W3a of one third line 26a is greater than the width W4a of one fourth line 30a by about 0.8 µm. Similarly, the width W3b of one third space 26b differs from the width W4b of one fourth space 30b by about 0.8 µm. For example, the width W3b of one third space 26b is greater than the width W4b of one fourth space 30b by about 0.8 µm.

In some embodiments, when the sum 36 of the width W3a of one third line 26a and the width W3b of one third space 26b is 17.6 µm (the sum 38 of the width W4a of one fourth line 30a and the width W4b of one fourth space 30b is correspondingly 16 µm), the width W3a of one third line 26a and the width W3b of one third space 26b may include any combination of sizes that is not equal to each other as listed above (only the sum 36 of the width W3a of one third line 26a and the width W3b of one third space 26b is 17.6 µm). Similarly, the width W4a of one fourth line 30a and the width W4b of one fourth space 30b may include any combination of sizes that is not equal to each other as listed above (only the sum 38 of the width W4a of one fourth line 30a and the width W4b of one fourth space 30b is 16 µm). Various combinations of sizes are not repeated here. In some embodiments, the width W3a of one third line 26a differs from the width W4a of one fourth line 30a by about 0.8 µm. For example, the width W3a of one third line 26a is greater than the width W4a of one fourth line 30a by about 0.8 µm. Similarly, the width W3b of one third space 26b differs from the width W4b of one fourth space 30b by about 0.8 µm. For example, the width W3b of one third space 26b is greater than the width W4b of one fourth space 30b by about 0.8 µm.

In some embodiments, when the sum 36 of the width W3a of one third line 26a and the width W3b of one third space 26b is 26.6 µm (the sum 38 of the width W4a of one fourth line 30a and the width W4b of one fourth space 30b is correspondingly 25 µm), the width W3a of one third line 26a and the width W3b of one third space 26b may include any combination of sizes that is not equal to each other as listed above (only the sum 36 of the width W3a of one third line 26a and the width W3b of one third space 26b is 26.6 µm). Similarly, the width W4a of one fourth line 30a and the width W4b of one fourth space 30b may include any combination of sizes that is not equal to each other as listed above (only the sum 38 of the width W4a of one fourth line 30a and the width W4b of one fourth space 30b is 25 µm). Various combinations of sizes are not repeated here. In some embodiments, the width W3a of one third line 26a differs from the width W4a of one fourth line 30a by about 0.8 µm. For example, the width W3a of one third line 26a is greater than the width W4a of one fourth line 30a by about 0.8 µm. Similarly, the width W3b of one third space 26b differs from the width W4b of one fourth space 30b by about 0.8 µm. For example, the width W3b of one third space 26b is greater than the width W4b of one fourth space 30b by about 0.8 µm.

In some embodiments, when the sum 36 of the width W3a of one third line 26a and the width W3b of one third space 26b is less than the sum 38 of the width W4a of one fourth line 30a and the width W4b of one fourth space 30b, the sum 36 of the width W3a of one third line 26a and the width W3b of one third space 26b is in a range from about 10 µm to about 25 µm, for example, 10 µm, 16 µm or 25 µm, and the sum 38 of the width W4a of one fourth line 30a and the width W4b of one fourth space 30b is in a range from about 11.6 µm to about 26.6 µm, for example, 11.6 µm, 17.6 µm or 26.6 µm. In some embodiments, when the sum 36 of the width W3a of one third line 26a and the width W3b of one third space 26b is less than the sum 38 of the width W4a of one fourth line 30a and the width W4b of one fourth space 30b, the width W3a of one third line 26a is in a range from about 1 µm to about 12 µm, the width W3b of one third space 26b is in a range from about 5.5 µm to about 24 µm, the width W4a of one fourth line 30a is in a range from about 1.8 µm to about 12.8 µm, and the width W4b of one fourth space 30b is in a range from about 6.3 µm to about 24.8 µm. The width W3b of one third space 26b is greater than the width W3a of one third line 26a. The width W4b of one fourth space 30b is greater than the width W4a of one fourth line 30a.

In some embodiments, when the sum 36 of the width W3a of one third line 26a and the width W3b of one third space 26b is 10 µm (the sum 38 of the width W4a of one fourth line 30a and the width W4b of one fourth space 30b is correspondingly 11.6 µm), the width W3a of one third line 26a and the width W3b of one third space 26b may include any combination of sizes that is not equal to each other as listed above (only the sum 36 of the width W3a of one third line 26a and the width W3b of one third space 26b is 10 µm). Similarly, the width W4a of one fourth line 30a and the width W4b of one fourth space 30b may include any combination of sizes that is not equal to each other as listed above (only the sum 38 of the width W4a of one fourth line 30a and the width W4b of one fourth space 30b is 11.6 µm). Various combinations of sizes are not repeated here. In some embodiments, the width W3a of one third line 26a differs from the width W4a of one fourth line 30a by about 0.8 µm. For example, the width W3a of one third line 26a is less than the width W4a of one fourth line 30a by about 0.8 µm. Similarly, the width W3b of one third space 26b differs from the width W4b of one fourth space 30b by about 0.8 µm. For example, the width W3b of one third space 26b is less than the width W4b of one fourth space 30b by about 0.8 µm.

In some embodiments, when the sum 36 of the width W3a of one third line 26a and the width W3b of one third space 26b is 16 µm (the sum 38 of the width W4a of one fourth line 30a and the width W4b of one fourth space 30b is correspondingly 17.6 µm), the width W3a of one third line 26a and the width W3b of one third space 26b may include any combination of sizes that is not equal to each other as listed above (only the sum 36 of the width W3a of one third line 26a and the width W3b of one third space 26b is 16 µm). Similarly, the width W4a of one fourth line 30a and the width W4b of one fourth space 30b may include any combination of sizes that is not equal to each other as listed above (only the sum 38 of the width W4a of one fourth line 30a and the width W4b of one fourth space 30b is 17.6 µm). Various combinations of sizes are not repeated here. In some embodiments, the width W3a of one third line 26a differs from the width W4a of one fourth line 30a by about 0.8 µm. For example, the width W3a of one third line 26a is less than the width W4a of one fourth line 30a by about 0.8 µm. Similarly, the width W3b of one third space 26b differs from the width W4b of one fourth space 30b by about 0.8 µm. For example, the width W3b of one third space 26b is less than the width W4b of one fourth space 30b by about 0.8 µm.

In some embodiments, when the sum 36 of the width W3a of one third line 26a and the width W3b of one third space 26b is 25 µm (the sum 38 of the width W4a of one fourth line 30a and the width W4b of one fourth space 30b is correspondingly 26.6 µm), the width W3a of one third line 26a and the width W3b of one third space 26b may include any combination of sizes that is not equal to each other as listed above (only the sum 36 of the width W3a of one third line 26a and the width W3b of one third space 26b is 25 µm). Similarly, the width W4a of one fourth line 30a and the width W4b of one fourth space 30b may include any combination of sizes that is not equal to each other as listed above (only the sum 38 of the width W4a of one fourth line 30a and the width W4b of one fourth space 30b is 26.6 µm). Various combinations of sizes are not repeated here. In some embodiments, the width W3a of one third line 26a differs from the width W4a of one fourth line 30a by about 0.8 µm. For example, the width W3a of one third line 26a is less than the width W4a of one fourth line 30a by about 0.8 µm. Similarly, the width W3b of one third space 26b differs from the width W4b of one fourth space 30b by about 0.8 µm. For example, the width W3b of one third space 26b is less than the width W4b of one fourth space 30b by about 0.8 µm.

In some embodiments, the alignment mark pattern 10 further includes a cross pattern 40. The cross pattern 40 is disposed between the first region 12 and the second region 14 and between the third region 16 and the fourth region 18. In some embodiments, the cross pattern 40 includes a fifth line 42 and a sixth line 44. The fifth line 42 is perpendicular to the sixth line 44. In some embodiments, the width "W" of the fifth line 42 and the sixth line 44 is in a range from about 3 µm to about 17 µm. In some embodiments, the length "L" of the fifth line 42 and the sixth line 44 is in a range from about 50 µm to about 100 µm.

Figure 2:
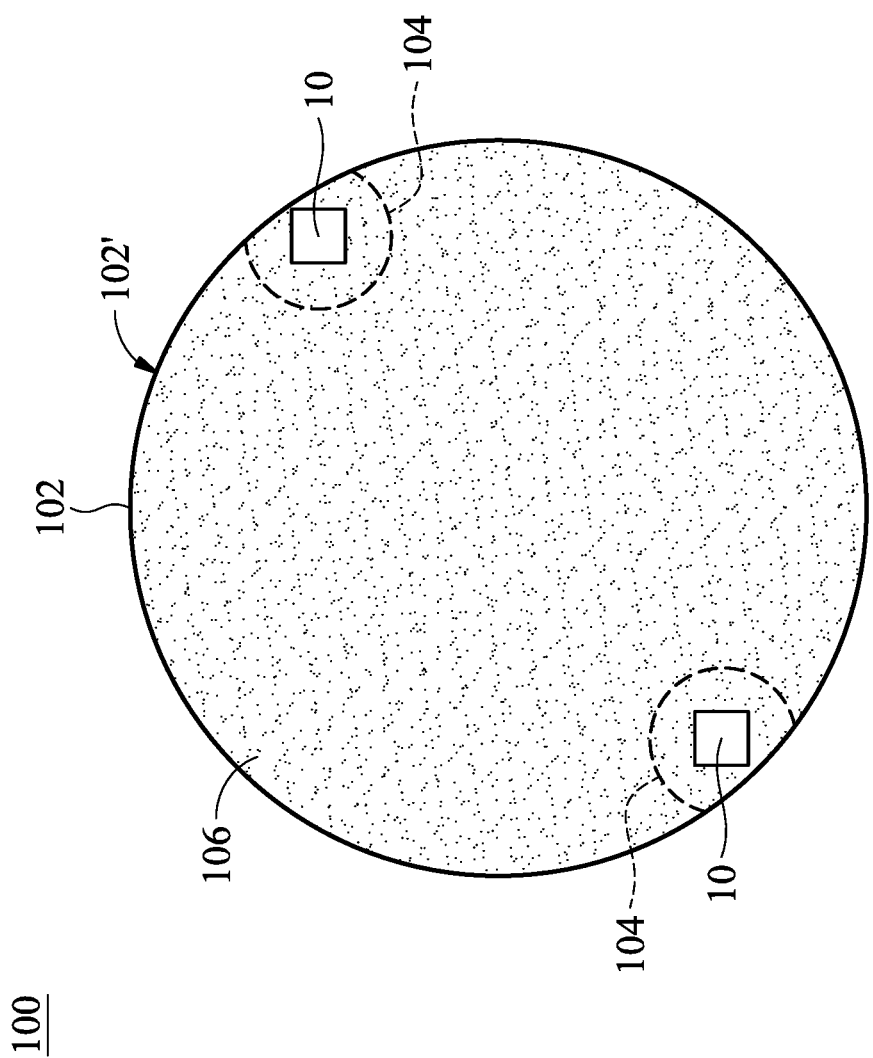
FIG. 2 is a top view of a wafer structure that includes alignment mark patterns in accordance with one embodiment of the invention.

Referring to FIG. 2, in accordance with one embodiment of the invention, a wafer structure 100 that includes the alignment mark pattern 10 as shown in FIG. 1 is provided. FIG. 2 is a top view of the wafer structure 100 that includes the alignment mark pattern 10 of FIG. 1.

As shown in FIG. 2, the wafer structure 100 includes a wafer 102 having a plurality of mark regions 104, a material layer 106, and a plurality of alignment mark patterns 10 of FIG. 1. The material layer 106 is formed on the wafer 102. The alignment mark patterns 10 are disposed on the material layer 106 and located within the mark regions 104 of the wafer 102 respectively.

In some embodiments, the mark regions 104 are adjacent to an edge 102' of the wafer 102. In some embodiments, the material layer 106 may include an epitaxial layer. In some embodiments, the thickness of the material layer 106 is in a range from about 6 µm to about 10 µm. In some embodiments, the alignment mark patterns 10 are opposite to each other, as shown in FIG. 2.

Example 1

Figure 3:
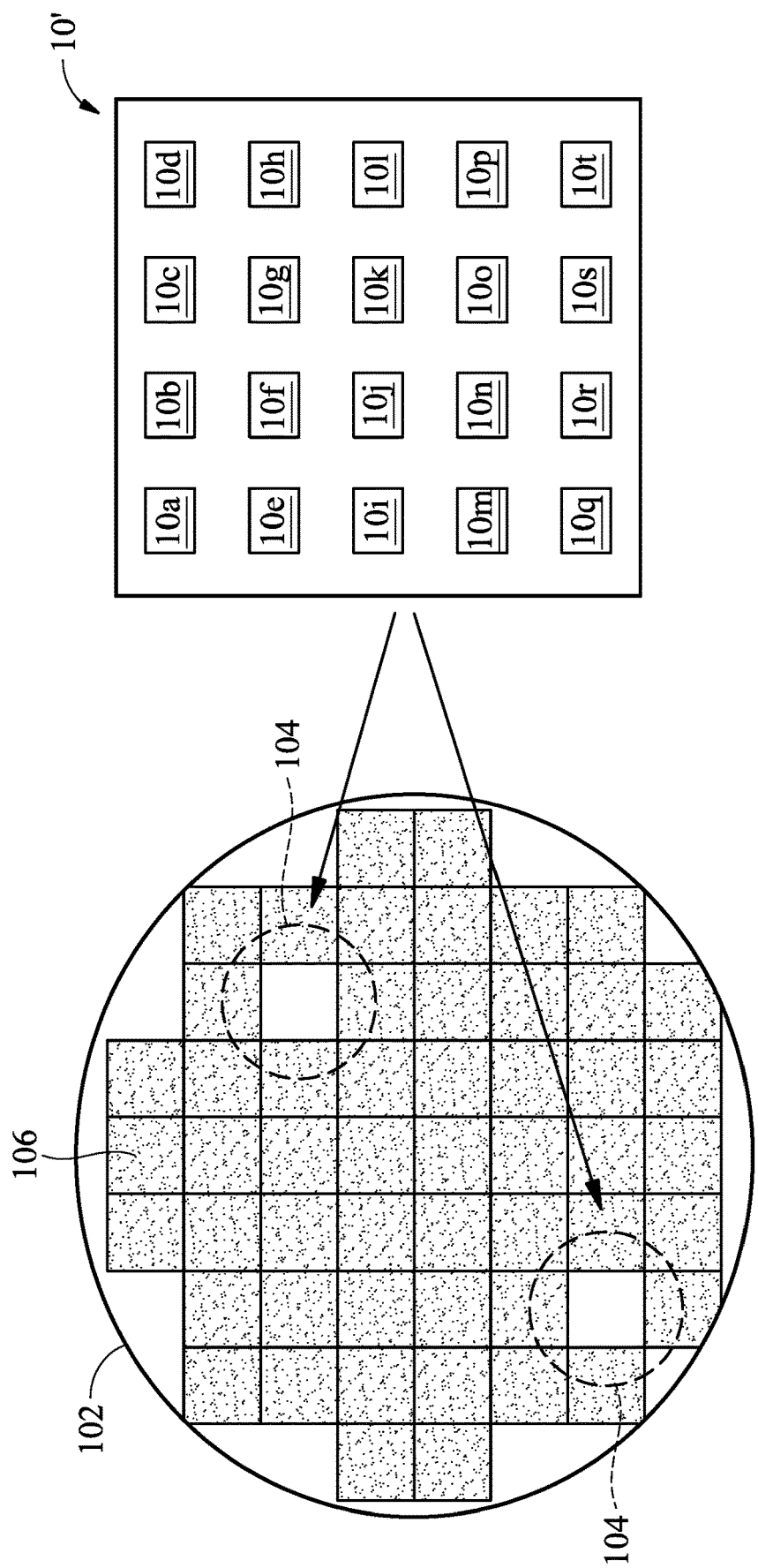
FIG. 3 shows a method for verifying the relationship between alignment mark patterns that include various sizes of lines and spaces and exposure signals in accordance with one embodiment of the invention.

Verifying the Relationship Between Alignment Mark Patterns that Include Various Sizes of Lines and Spaces and Exposure Signals Referring to FIG. 3, a method for verifying the relationship between alignment mark patterns that include various sizes of lines and spaces and exposure signals is as follows. First, a wafer 102 is provided. Next, an 8 µm-thick epitaxial material layer 106 is formed on the wafer 102. Next, 20 sets of alignment mark patterns (10a, 10b, 10c, 10d, 10e, 10f, 10g, 10h, 10i, 10j, 10k, 10l, 10m, 10n, 10o, 10p, 10q, 10r, 10s and 10t) configured on a photomask 10' is exposed onto the epitaxial material layer 106 and located within two mark regions 104 of the wafer 102 respectively. In this example (referring to FIG. 1), among the 20 sets of the alignment mark patterns (10a, 10b, 10c, 10d, 10e, 10f, 10g, 10h, 10i, 10j, 10k, 10l, 10m, 10n, 10o, 10p, 10q 10r, 10s and 10t), the sum (pitch) 32 of the width W1a of one first line 20a and the width W1b of one first space 20b within the first region 12 is 17.6 µm. The sum (pitch) 38 of the width W4a of one fourth line 30a and the width W4b of one fourth space 30b within the fourth region 18 is 17.6 µm. The sum (pitch) 34 of the width W2a of one second line 24a and the width W2b of one second space 24b within the second region 14 is 16 µm. The sum (pitch) 36 of the width W3a of one third line 26a and the width W3b of one third space 26b within the third region 16 is 16 µm. The size distribution of each line and space in the 20 sets of the alignment mark patterns (10a, 10b, 10c, 10d, 10e, 10f, 10g, 10h, 10i, 10j, 10k, 10l, 10m, 10n, 10o, 10p, 10q 10r, 10s and 10t) is shown in Table 1. The 20 sets of the alignment mark patterns (10a, 10b, 10c, 10d, 10e, 10f, 10g, 10h, 10i, 10j, 10k, 10l, 10m, 10n, 10o, 10p, 10q 10r, 10s and 10t) are configured on the photomask 10' from left to right and from top to bottom thereof

TABLE 1 the size distribution of each line and space in the alignment mark patterns

|  | The first region line/space | The second region line/space | The third region line/space | The fourth region line/space |
| --- | --- | --- | --- | --- |
| 10a | 1.8/15.8 | 1/15 | 1/15 | 1.8/15.8 |
| 10b | 2.3/15.3 | 1.5/14.5 | 1.5/14.5 | 2.3/15.3 |
| 10c | 2.8/14.8 | 2/14 | 2/14 | 2.8/14.8 |
| 10d | 3.3/14.3 | 2.5/13.5 | 2.5/13.5 | 3.3/14.3 |
| 10e | 3.8/13.8 | 3/13 | 3/13 | 3.8/13.8 |
| 10f | 4.3/13.3 | 3.5/12.5 | 3.5/12.5 | 4.3/13.3 |
| 10g | 4.8/12.8 | 4/12 | 4/12 | 4.8/12.8 |
| 10h | 5.3/12.3 | 4.5/11.5 | 4.5/11.5 | 5.3/12.3 |
| 10i | 5.8/11.8 | 5/11 | 5/11 | 5.8/11.8 |
| 10j | 6.3/11.3 | 5.5/10.5 | 5.5/10.5 | 6.3/11.3 |
| 10k | 6.8/10.8 | 6/10 | 6/10 | 6.8/10.8 |
| 10l | 7.8/9.8 | 7/9 | 7/9 | 7.8/9.8 |

TABLE 1-continued the size distribution of each line and
space in the alignment mark patterns

|  | The first region line/space | The second region line/space | The third region line/space | The fourth region line/space |
| --- | --- | --- | --- | --- |
| 10m | 8.8/8.8 | 8/8 | 8/8 | 8.8/8.8 |
| 10n | 9.8/7.8 | 9/7 | 9/7 | 9.8/7.8 |
| 10o | 10.8/6.8 | 10/6 | 10/6 | 10.8/6.8 |
| 10p | 11.8/5.8 | 11/5 | 11/5 | 11.8/5.8 |
| 10q | 12.8/4.8 | 12/4 | 12/4 | 12.8/4.8 |
| 10r | 13.8/3.8 | 13/3 | 13/3 | 13.8/3.8 |
| 10s | 14.8/2.8 | 14/2 | 14/2 | 14.8/2.8 |
| 10t | 15.8/1.8 | 15/1 | 15/1 | 15.8/1.8 |

Figure 4:
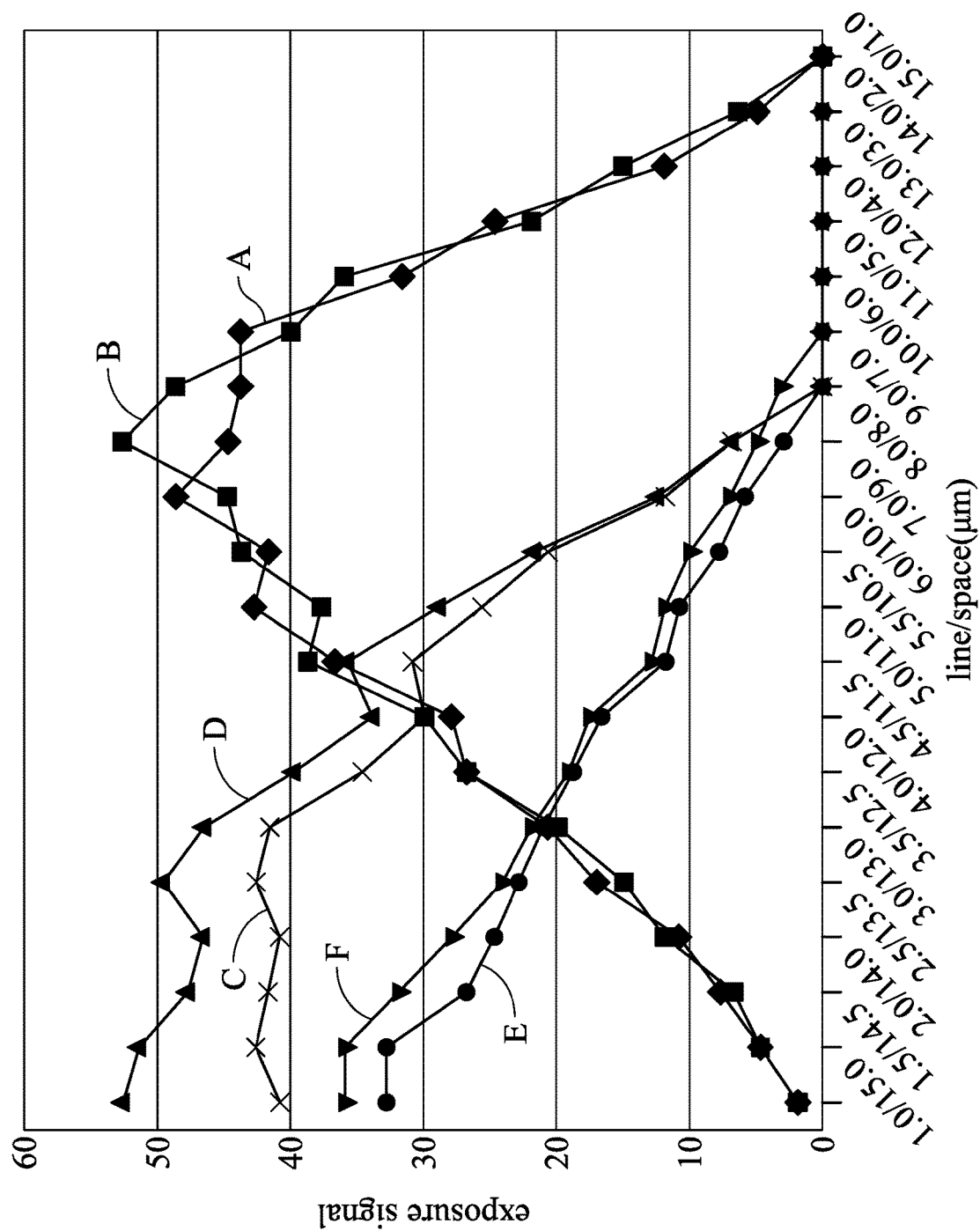
FIG. 4 shows the relationship between alignment mark patterns that include various sizes of lines and spaces and exposure signals in accordance with one embodiment of the invention.

Next, a first exposure signal test is performed on the 20 sets of the alignment mark patterns (10a, 10b, 10c, 10d, 10e, 10f, 10g, 10h, 10i, 10j, 10k, 10l, 10m, 10n, 10o, 10p, 10q 10r, 10s and 10t) which are located on the epitaxial material layer 106. The variations of the measured exposure signal intensity in the first exposure signal test are presented as curve A (the depth of the spaces is about 120 nm) and curve B (the depth of the spaces is about 150 nm), as shown in FIG. 4. Next, a 6 µm-thick second epitaxial material layer (not shown) is formed on the epitaxial material layer 106. Next, a second exposure signal test is performed on the 20 sets of the alignment mark patterns (10a, 10b, 10c, 10d, 10e, 10f, 10g, 10h, 10i, 10j, 10k, 10l, 10m, 10n, 10o, 10p, 10q 10r, 10s and 10t) which are located on the epitaxial material layer 106. The variations of the measured exposure signal intensity in the second exposure signal test are presented as curve C (the depth of the spaces is about 120 nm) and curve D (the depth of the spaces is about 150 nm), as shown in FIG. 4. Next, a 2 µm-thick third epitaxial material layer (not shown) is formed on the second epitaxial material layer. Next, a third exposure signal test is performed on the 20 sets of the alignment mark patterns (10a, 10b, 10c, 10d, 10e, 10f, 10g, 10h, 10i, 10j, 10k, 10l, 10m, 10n, 10o, 10p, 10q 10r, 10s and 10t) which are located on the epitaxial material layer 106. The variations of the measured exposure signal intensity in the third exposure signal test are presented as curve E (the depth of the spaces is about 120 nm) and curve F (the depth of the spaces is about 150 nm), as shown in FIG. 4.

As seen from FIG. 4, when the second exposure signal test is performed on the 20 sets of the alignment mark patterns which are on the epitaxial material layer 106 (at this time, the alignment mark patterns are covered by the 6 µm-thick second epitaxial material layer), the 12 sets of the alignment mark patterns (10a, 10b, 10c, 10d, 10e, 10f, 10g, 10h, 10i, 10j, 10k and 10l) with various sizes of lines and spaces and the space size larger than the line size can achieve an exposure signal intensity of 1 or more. Similarly, when the third exposure signal test is performed on the 20 sets of the alignment mark patterns which are on the epitaxial material layer 106 (at this time, the alignment mark patterns are covered by the 6 µm-thick second epitaxial material layer and the 2 µm-thick third epitaxial material layer), the 12 sets of the alignment mark patterns (10a, 10b, 10c, 10d, 10e, 10f, 10g, 10h, 10i, 10j, 10k and 10l) with various sizes of lines and spaces and the space size larger than the line size can still achieve an exposure signal intensity of 1 or more. That is, the alignment mark patterns composed of specific sizes of lines and spaces provided by the present invention, despite the implementation of multiple epitaxial processes, still exhibit fairly good exposure signal strength without setting an extra alignment mark pattern to continue the subsequent alignment process.

In the present invention, depending on the process requirements, the specific alignment mark patterns that include appropriate sum (pitch) of widths of single line and space (for example, the sum (pitch) of the widths of single line and space is between 10 µm and 25 µm) with various sizes of lines and spaces and the space size larger than the line size is designed to use for alignment in a semiconductor process. Different from the traditional design to make the line and space into the same size, in the present invention, the space size is designed to be larger than the line size, so that even after multiple epitaxial processes, the spaces with sufficient depth/width can accommodate more epitaxial materials therein, and the alignment mark patterns can maintain a fairly good exposure signal intensity, effectively improving the problems with the traditional stepper having a poor ability to capture the exposure signals of the alignment marks. These problems result from increasing the number of epitaxial processes or increasing the thickness of the epitaxial layer. In the present invention, there is no need to add alignment mark patterns on other layers. The subsequent alignment process can be performed continuously, which not only reduces the overall production cost but also eliminates the processing time required to conduct additional processes.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An alignment mark pattern, comprising:
   a first region that includes a plurality of first lines and a plurality of first spaces which are arranged to alternate with each other and which extend in a first direction, wherein one first space has a width greater than that of one first line;
   a second region that includes a plurality of second lines and a plurality of second spaces which are arranged to alternate with each other and which extend in the first direction, the second region being diagonal to the first region, wherein one second space has a width greater than that of one second line;
   a third region that includes a plurality of third lines and a plurality of third spaces which are arranged to alternate with each other and which extend in a second direction perpendicular to the first direction, the third region being adjacent to the first region and the second region, wherein one third space has a width greater than that of one third line; and
   a fourth region that includes a plurality of fourth lines and a plurality of fourth spaces which are arranged to alternate with each other and which extend in the second direction, the fourth region being diagonal to the third region and adjacent to the first region and the second region, wherein one fourth space has a width greater than that of one fourth line.

2. The alignment mark pattern as claimed in claim 1, wherein a sum of the width of one first line and the width of one first space is greater than or less than a sum of the width of one second line and the width of one second space.

3. The alignment mark pattern as claimed in claim 2, wherein when the sum of the width of one first line and the width of one first space is greater than the sum of the width of one second line and the width of one second space, the sum of the width of one first line and the width of one first space is in a range from about 11.6 μm to about 26.6 μm, and the sum of the width of one second line and the width of one second space is in a range from about 10 μm to about 25 μm.

4. The alignment mark pattern as claimed in claim 3, wherein when the sum of the width of one first line and the width of one first space is greater than the sum of the width of one second line and the width of one second space, the width of one first line is in a range from about 1.8 μm to about 12.8 μm, the width of one first space is in a range from about 6.3 μm to about 24.8 μm, the width of one second line is in a range from about 1 μm to about 12 μm, and the width of one second space is in a range from about 5.5 μm to about 24 μm.

5. The alignment mark pattern as claimed in claim 2, wherein when the sum of the width of one first line and the width of one first space is less than the sum of the width of one second line and the width of one second space, the sum of the width of one first line and the width of one first space is in a range from about 10 μm to about 25 μm, and the sum of the width of one second line and the width of one second space is in a range from about 11.6 μm to about 26.6 μm.

6. The alignment mark pattern as claimed in claim 5, wherein when the sum of the width of one first line and the width of one first space is less than the sum of the width of one second line and the width of one second space, the width of one first line is in a range from about 1 μm to about 12 μm, the width of one first space is in a range from about 5.5 μm to about 24 μm, the width of one second line is in a range from about 1.8 μm to about 12.8 μm, and the width of one second space is in a range from about 6.3 μm to about 24.8 μm.

7. The alignment mark pattern as claimed in claim 1, wherein a sum of the width of one third line and the width of one third space is greater than or less than a sum of the width of one fourth line and the width of one fourth space.

8. The alignment mark pattern as claimed in claim 7, wherein when the sum of the width of one third line and the width of one third space is greater than the sum of the width of one fourth line and the width of one fourth space, the sum of the width of one third line and the width of one third space is in a range from about 11.6 μm to about 26.6 μm, and the sum of the width of one fourth line and the width of one fourth space is in a range from about 10 μm to about 25 μm.

9. The alignment mark pattern as claimed in claim 8, wherein when the sum of the width of one third line and the width of one third space is greater than the sum of the width of one fourth line and the width of one fourth space, the width of one third line is in a range from about 1.8 μm to about 12.8 μm, the width of one third space is in a range from about 6.3 μm to about 24.8 μm, the width of one fourth line is in a range from about 1 μm to about 12 μm, and the width of one fourth space is in a range from about 5.5 μm to about 24 μm.

10. The alignment mark pattern as claimed in claim 7, wherein when the sum of the width of one third line and the width of one third space is less than the sum of the width of one fourth line and the width of one fourth space, the sum of the width of one third line and the width of one third space is in a range from about 10 μm to about 25 μm, and the sum of the width of one fourth line and the width of one fourth space is in a range from about 11.6 μm to about 26.6 μm.

11. The alignment mark pattern as claimed in claim 10, wherein when the sum of the width of one third line and the width of one third space is less than the sum of the width of one fourth line and the width of one fourth space, the width of one third line is in a range from about 1 μm to about 12 μm, the width of one third space is in a range from about 5.5 μm to about 24 μm, the width of one fourth line is in a range from about 1.8 μm to about 12.8 μm, and the width of one fourth space is in a range from about 6.3 μm to about 24.8 μm.

12. The alignment mark pattern as claimed in claim 1, further comprising a cross pattern disposed between the first region and the second region and between the third region and the fourth region.

13. The alignment mark pattern as claimed in claim 12, wherein the cross pattern comprises a fifth line and a sixth line perpendicular to the fifth line.

14. The alignment mark pattern as claimed in claim 13, wherein the fifth line and the sixth line have a width which is in a range from about 3 μm to about 17 μm.

15. The alignment mark pattern as claimed in claim 13, wherein the fifth line and the sixth line have a length which is in a range from about 50 μm to about 100 μm.

16. A wafer structure, comprising:
a wafer having a plurality of mark regions;
a material layer formed on the wafer; and
a plurality of alignment mark patterns as claimed in claim 1 disposed on the material layer and located within the respective mark regions of the wafer.

17. The wafer structure as claimed in claim 16, wherein the mark regions are adjacent to an edge of the wafer.

18. The wafer structure as claimed in claim 16, wherein the material layer comprises an epitaxial layer.

19. The wafer structure as claimed in claim 16, wherein the material layer has a thickness which is in a range from about 6 μm to about 10 μm.

20. The wafer structure as claimed in claim 16, wherein the alignment mark patterns are opposite to each other.

* * * * *